(12) United States Patent
Kanazawa et al.

(10) Patent No.: US 8,052,505 B2
(45) Date of Patent: Nov. 8, 2011

(54) WAFER PROCESSING METHOD FOR PROCESSING WAFER HAVING BUMPS FORMED THEREON

(75) Inventors: Masaki Kanazawa, Mitaka (JP); Hajime Akahori, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 462 days.

(21) Appl. No.: 12/360,610

(22) Filed: Jan. 27, 2009

(65) Prior Publication Data
US 2009/0191796 A1 Jul. 30, 2009

(30) Foreign Application Priority Data
Jan. 30, 2008 (JP) .................................. 2008-018927

(51) Int. Cl.
B24B 1/00 (2006.01)
(52) U.S. Cl. ............. 451/54; 451/58; 451/29; 451/388; 451/398
(58) Field of Classification Search ................... 451/54, 451/58, 41, 388, 398, 29; 438/689–690, 438/977, 928, 612; 216/52; 29/527.1, 527.2
See application file for complete search history.

(56) References Cited

U.S. PATENT DOCUMENTS

| 6,702,652 | B2 * | 3/2004 | Arai ................. 451/41 |
| 7,025,891 | B2 * | 4/2006 | Codding et al. ............ 216/12 |
| 7,037,758 | B2 * | 5/2006 | Karasawa et al. .......... 438/113 |
| 7,059,942 | B2 * | 6/2006 | Strasbaugh et al. ........... 451/41 |
| 7,105,424 | B2 | 9/2006 | Tsai et al. |
| 7,438,631 | B2 * | 10/2008 | Nagamoto et al. ............. 451/59 |
| 7,722,446 | B2 * | 5/2010 | Krywanczyk et al. ........ 451/451 |
| 2004/0157359 | A1 | 8/2004 | Stecher |

FOREIGN PATENT DOCUMENTS

| JP | 2005-109433 | 4/2005 |
| JP | 2005-311402 | 11/2005 |

OTHER PUBLICATIONS

Singapore Search Report dated Apr. 8, 2009, for corresponding Singapore application 2008095093, noting listed references in this IDS.

* cited by examiner

*Primary Examiner* — George Nguyen
(74) *Attorney, Agent, or Firm* — Christie, Parker & Hale, LLP.

(57) ABSTRACT

A wafer processing method for processing a wafer (20) having bumps (B) formed on a front surface (21) comprises the steps of: holding on a table (51), a bump region-conforming member (40) that has an outer shape conforming only to a bump region (25) where said bumps are formed in the wafer; forming a resin layer (29) by applying resin around the bump region-conforming member up to a thickness equal to or greater than that of the bump region-conforming member; grinding the bump region-conforming member along with the resin layer to a predetermined thickness; removing the bump region-conforming member from the table to form a concave part (45) in the resin layer; applying a film (11) on the front surface of the wafer; and disposing the wafer in the concave part of the resin layer and holding the wafer on the table so that a back surface (22) of said wafer faces upward. After that, the back surface of the wafer can also be ground. As a result, a change in the size of the bumps can be easily accommodated without creating clearance.

4 Claims, 4 Drawing Sheets

Fig. 3a
Fig. 3b
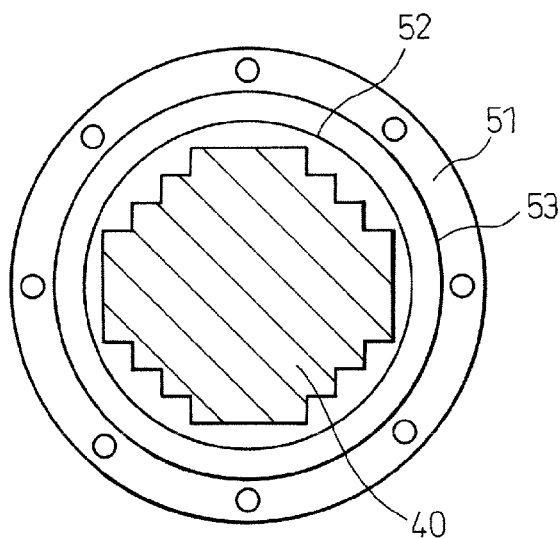
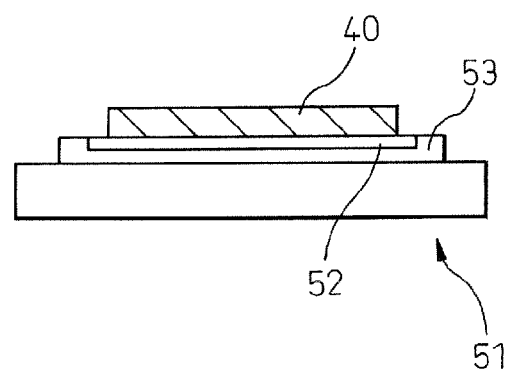
Fig. 4a
Fig. 4b
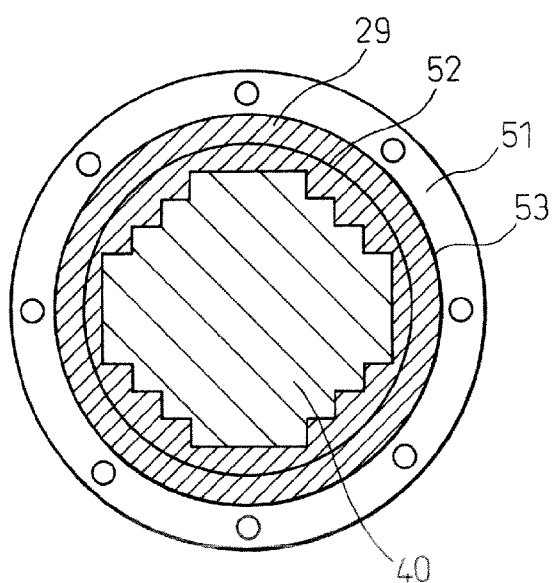
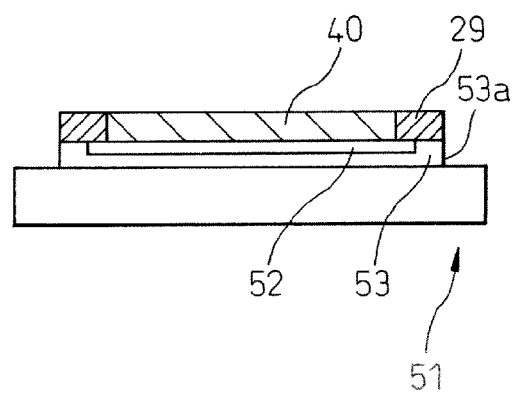

WAFER PROCESSING METHOD FOR PROCESSING WAFER HAVING BUMPS FORMED THEREON

CROSS-REFERENCE TO RELATED APPLICATION

This application claims priority of Japanese Patent Application Number 2008-018927, filed on Jan. 30, 2008.

BACKGROUND OF THE INVENTION

1. Field of the Invention

The present invention relates to a wafer processing method for processing a wafer having a plurality of bumps formed on its front surface.

2. Description of the Related Art

In the field of semiconductor manufacturing, wafers tend to become larger year after year and the wafers are made thinner for increasing packing density. In order to make a semiconductor wafer thinner, a backgrinding process for grinding a back surface of the wafer is performed. In the backgrinding process, a surface protection film is applied to a front surface of the wafer for protecting chips formed on the front surface of the wafer.

After the backgrinding process is finished, a dicing film application device applies a dicing film to the back surface of the wafer, so that the wafer is integrated with a mount frame. Then, the surface protection film that has been applied to the front surface of the wafer is removed, and then, the wafer is diced into chips. Each chip formed by the dicing process is picked up and mounted on a lead frame.

FIG. 8 is a cross-sectional view of a wafer before the backgrinding process in the conventional art. As illustrated in FIG. 8, bumps B as electrical contacts are formed on each chip C on the front surface of the wafer. Because of chips C and bumps B formed thereon, front surface 21 of wafer 20 is not flat. As can be seen from FIG. 8, when surface protection film 110 is applied to front surface 21 of wafer 20, a central region of wafer 20 is elevated from its peripheral region. In other words, a step is formed on the front surface protection film 110.

As illustrated in FIG. 9, wafer 20 is turned upside down and mounted on a table 51 for grinding the back surface 22 of wafer 20. Table 51 is provided with a suction section 52 that is slightly smaller than the outer shape of wafer 20. Because surface protection film 110 is elevated in the central region, it is not in contact with suction section 52 in the peripheral region. Therefore, as illustrated in the figure, in the peripheral region, an annular clearance is formed between the surface protection film 110 and suction section 52.

In this state, when back surface 22 of wafer 20 is ground, stress may be concentrated on the central region of wafer 20 and, as a result, bumps B located in the central region and/or wafer 20 itself may be damaged. Further, because the peripheral region of wafer 20 is not sucked by suction section 52, the edge of wafer 20 may be broken during the backgrinding process. Still further, during the backgrinding process, shavings may be sucked through the annular clearance by suction section 52 and, as a result, suction section 52 may be clogged.

In order to solve these problems, Japanese Unexamined Patent Publication No. 2005-109433 discloses a technique for covering the front surface of the wafer by a cup-shaped protection member that is provided with a peripheral adhesive part adhering to the peripheral region of the wafer. When such protection member is used, the stress during the backgrinding process is distributed over the entire wafer, and therefore the above-mentioned problems can be avoided.

However, the protection member disclosed in Japanese Unexamined Patent Publication No. 2005-109433, which is a special-purpose product conforming only to the bumps of a particular size, is expensive and therefore the cost of the resultant semiconductor chip is increased. Considering the fact that this protection member is used only during the backgrinding process and eventually discarded, it is desirable to reduce the cost of the protection member as much as possible.

Further, because the protection member is the special-purpose product, even when the height of the bumps is changed only slightly, the protection member cannot protect the bumps properly. In this case, if the protection member is used as it is without modification, the problems such as the damage to the wafer and/or bumps, the breakage of the edge of the wafer, and the clogging of the suction section may occur again.

The present invention has been made in view of such circumstances and it is an object of the present invention to provide an inexpensive wafer processing method that can easily accommodate change of size of bumps without creating clearance between a wafer and a table.

SUMMARY OF THE INVENTION

In order to accomplish the above object, according to a first aspect, there is provided a wafer processing method for processing a wafer having bumps formed on its front surface, comprising the steps of: holding, on a table, a bump region-conforming member that has an outer shape conforming only to a bump region of said wafer where said bumps are formed; forming a resin layer by applying resin around said bump region-conforming member up to a thickness equal to or greater than that of said bump region-conforming member; grinding said bump region-conforming member along with said resin layer to a predetermined thickness; removing said bump region-conforming member from said table to form a concave part in said resin layer; applying a film on the front surface of said wafer; and disposing said wafer in said concave part of said resin layer and holding said wafer on said table so that a back surface of said wafer faces upward.

Thus, in the first aspect, when the wafer is held on the table, a peripheral region of the wafer is mounted on the resin layer. Therefore, no clearance is formed between the wafer and the table. Further, change of size of the bumps can be easily accommodated by changing the grinding amount of both the bump region-conforming member and the resin layer depending on the height of the bumps and, therefore, the need for preparing a special-purpose protection member can be eliminated.

According to a second aspect, in the first aspect, said predetermined thickness is equal to the distance between said front surface of said wafer and the top of said bumps.

Thus, in the second aspect, the clearance that may be created when the wafer is mounted on the table can be eliminated substantially completely.

According to a third aspect, in the first or second aspect, further, the back surface of said wafer is ground.

Thus, in the third aspect, during the backgrinding process, damage of the wafer and/or bumps, breakage of an edge of the wafer, and clogging of a suction section can be eliminated.

According to a fourth aspect, in any of the first to third aspects, said bump region-conforming member is made of another wafer that has a size identical to that of said wafer.

Thus, in the fourth aspect, cost of processing the wafer can be reduced to be inexpensive.

These and other objects, features and advantages of the present invention will be more apparent from the detailed description of the typical embodiments of the present invention illustrated in the accompanying drawings.

BRIEF DESCRIPTION OF THE DRAWINGS

FIG. 3a is a first top view of a table;

FIG. 3b is a first cross-sectional view of a table;

FIG. 4a is a second top view of a table;

FIG. 4b is a second cross-sectional view of a table;

DETAILED DESCRIPTION OF THE PREFERRED EMBODIMENTS

Figure 1:
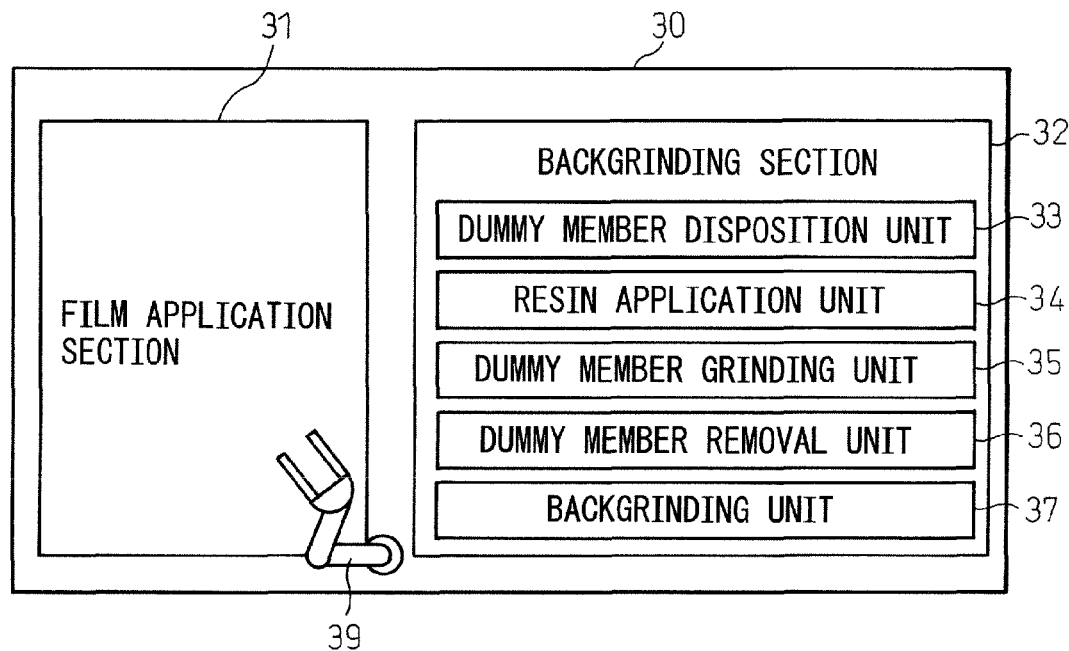
FIG. 1 is a schematic diagram of a wafer processing apparatus for performing a wafer processing method according to the present invention.

Hereinafter, the embodiments of the present invention will be described in detail with reference to the accompanying drawings. Throughout the several views, like elements are designated by like reference numerals. For ease of understanding, the scale of these drawings is changed appropriately.

FIG. 1 is a schematic diagram of a wafer processing apparatus for performing a wafer processing method according to the present invention. It is assumed that a silicon wafer 20 is supplied to wafer processing apparatus 30 illustrated in FIG. 1, wherein a plurality of chips C each comprising bumps B are formed on a front surface 21 of silicon wafer 20. (See FIG. 2b described later.) As can be seen from FIG. 1, wafer processing apparatus 30 mainly includes: a film application section 31 for applying a surface protection film 11 on wafer 20; and a backgrinding section 32 for grinding a back surface 22 of wafer 20.

Backgrinding section 32 includes: a dummy member disposition unit 33 for disposing a dummy member 40 on a table 51; a resin application unit 34 for applying resin around dummy member 40 to form a resin layer 29; a dummy member grinding unit 35 for grinding dummy member 40 and resin layer 29 to a predetermined thickness; a dummy member removal unit 36 for removing ground dummy member 40; and a backgrinding unit 37 for grinding back surface 22 of wafer 20. Here, backgrinding unit 37 may also serve as dummy member grinding unit 35.

Figure 2A:
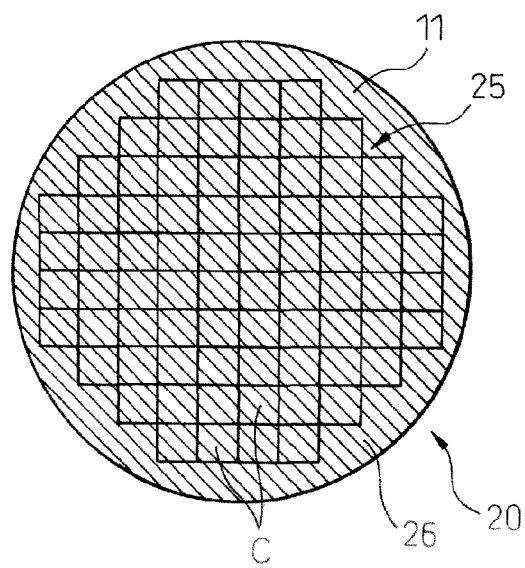
FIG. 2a is a top view of a wafer.
Figure 2B:
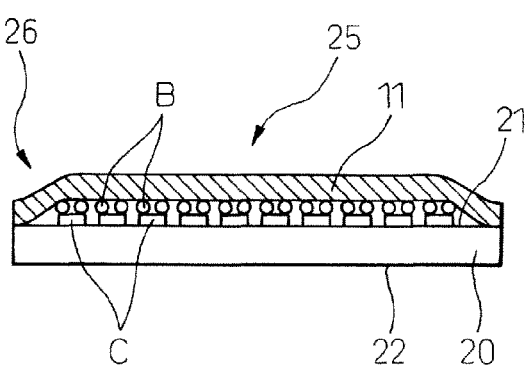
FIG. 2b is a cross-sectional view of a wafer.
Figure 5A:
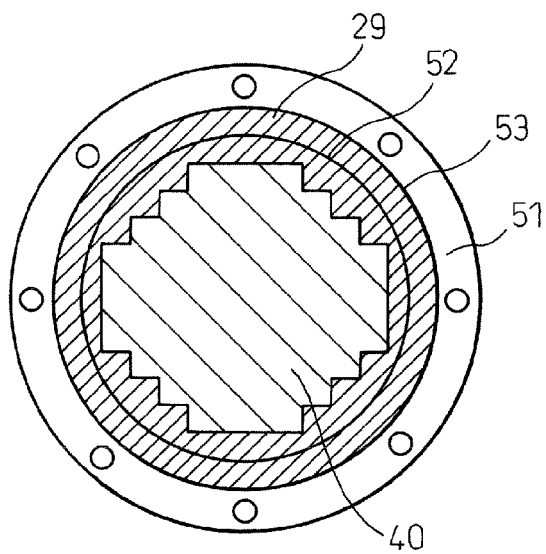
FIG. 5a is a third top view of a table.
Figure 5B:
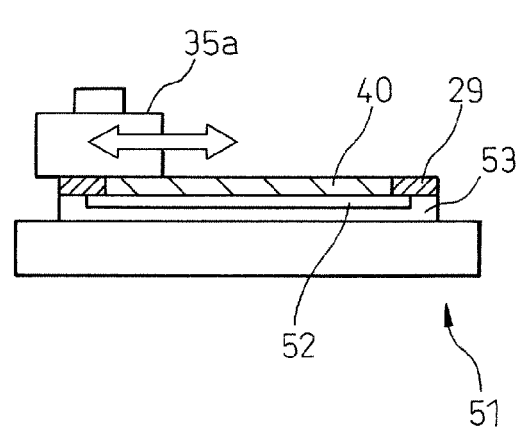
FIG. 5b is a third cross-sectional view of a table.
Figure 6A:
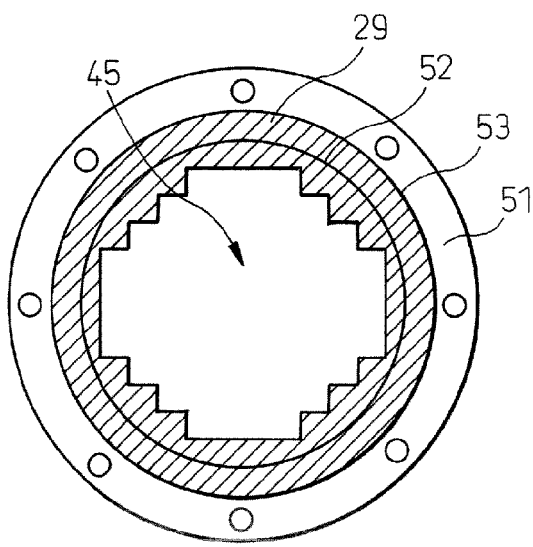
FIG. 6a is a fourth top view of a table.
Figure 6B:
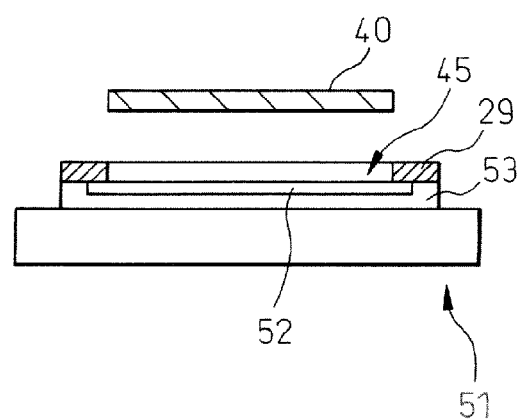
FIG. 6b is a fourth cross-sectional view of a table.

FIGS. 2a and 2b are top and cross-sectional views of the wafer, respectively. For the sake of simplicity, bumps B are not illustrated in FIG. 2a. As can be seen from these figures, the plurality of chips C are formed only in a central region 25 of front surface 21 of wafer 20 and bumps B are formed in each of chips C. Then, these chips C and bumps B are not formed in a peripheral region 26 of wafer 20. Therefore, hereinafter, central region 25 is referred to as a bump region 25.

First, as illustrated in FIG. 2a, in film application section 31, surface protection film 11 is applied to the entire front surface 21 of wafer 20. This surface protection film 11 protects chips C and bumps B on front surface 21 during the backgrinding process described below. As can be seen from FIG. 2b, after surface protection film 11 is applied, a step is formed between bump region 25 and peripheral region 26. Here, though not illustrated in the figures, it is to be noted that, in reality, surface protection film 11 is slightly concaved between bumps B.

FIGS. 3a-6a and FIGS. 3b-6b are top and cross-sectional views of table 51 in backgrinding section 32, respectively. As illustrated in these figures, table 51 mainly has: a table peripheral section 53; and a suction section 52 included in table peripheral section 53. Table peripheral section 53 has an outer diameter slightly larger than the diameter of wafer 20. Further, suction section 52 is connected to a vacuum source (not illustrated in the figures) and it has an outer diameter slightly smaller than the diameter of wafer 20.

Then, dummy member disposition unit 33 is used to dispose dummy member 40 concentrically with suction section 52 (See FIGS. 3a and 3b). As can be seen from the comparison between FIGS. 2a and 3a, dummy member 40 has an outer shape slightly larger than that of bump region 25 of wafer 20. Dummy member 40 is made of a material that can be ground by a grindstone 32a described later, such as, for example, silicon or plastic.

In one embodiment, dummy member 40 is formed by cutting out, by laser, for example, a wafer that has a shape identical to wafer 20. In such case, it is advantageous that the cost of processing wafer 20 described later can be reduced to be inexpensive.

Then, resin application unit 34 is used to apply resin such as, for example, thermoset resin around dummy member 40. As can be seen from FIGS. 4a and 4b, the resin is applied so as to be flush with both a peripheral surface 53a of table peripheral section 53 and a top surface of dummy member 40.

At this time, a frame and the like (not illustrated in the figures) surrounding table peripheral section 53 may be used, or a sheet may be disposed on suction section 52 around dummy member 40. Further, the resin may be applied beyond peripheral surface 53a of table peripheral section 53, or the resin may be applied beyond the top surface of dummy member 40. Alternatively, a portion of the resin may be applied on the top surface of dummy member 40. After the resin is applied, it is hardened by natural drying or heat treatment. As a result, resin layer 29 or in other words, a ring-shaped resin-made member is formed around dummy member 40.

Then, suction section 52 is activated to suck the dummy member 40 and resin layer 29 an table 51. Then, grindstone 35a of dummy member grinding unit 35 grinds the top surface of dummy member 40. (See FIGS. 5a and 5b.) At this time, resin layer 29 is also ground together and, as a result, dummy member 40 and resin layer 29 are ground to a predetermined thickness. This predetermined thickness is approximately equal to the distance between front surface 21 of wafer 20 and the top of bumps B. In other words, this predetermined thickness is approximately equal to the step in front surface protection film 11 between bump region 25 and peripheral region 26 of wafer 20.

Then, the suction effect of suction section 52 is deactivated. Then, dummy member removal unit 36 is used to remove ground dummy member 40 from resin layer 29. (See FIGS. 6a and 6b.) As a result, a concave part 45 comprised of the inner side surface of resin layer 29 and the top surface of suction section 52 is formed inside ring-shaped resin layer 29. As a matter of course, the outer shape of concave part 45 corresponds to bump region 25 of wafer 20.

Figure 7:
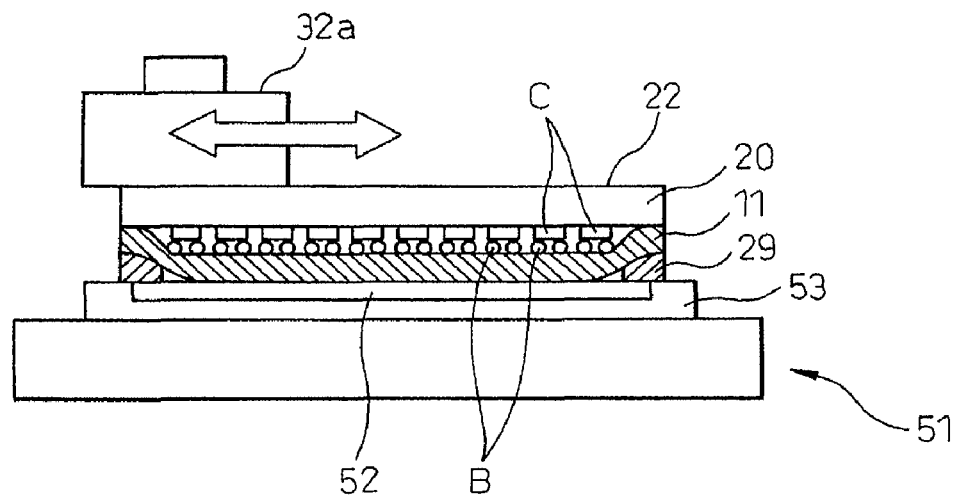
FIG. 7 is a cross-sectional view of a wafer disposed on a table.
Figure 8:
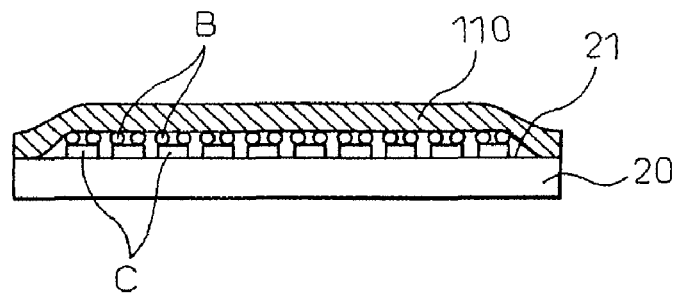
FIG. 8 is a cross-sectional view of a wafer in the conventional technique.
Figure 9:
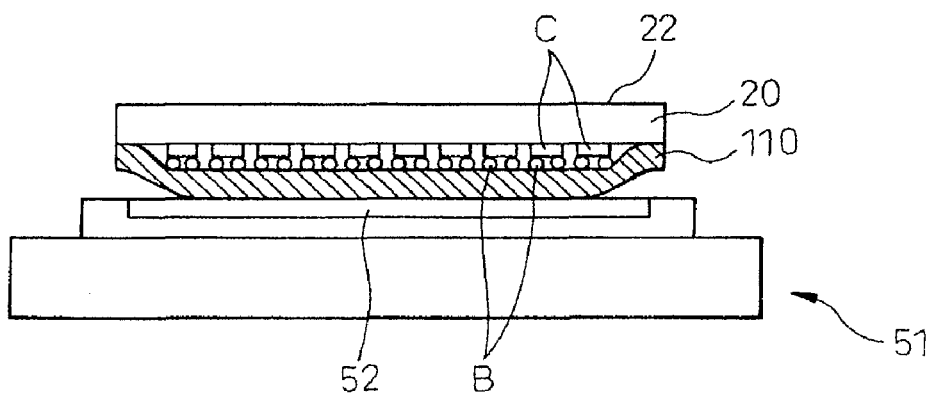
FIG. 9 is a cross-sectional view of a wafer disposed on a table in the conventional technique.

After that, wafer 20 with surface protection film 11 applied thereto is conveyed from film application section 31 to backgrinding section 32 by a robot hand 39 and held on table 51 (See FIG. 1). FIG. 7 is a cross-sectional view of the wafer disposed on table 51 in backgrinding section 32. As illustrated in FIG. 7, in backgrinding section 32, wafer 20 is disposed on table 51 so that its back surface 22 faces upward and sucked by suction section 52.

As described above, resin layer 29 has been formed on table 51. Therefore, when wafer 20 is disposed on table 51, as illustrated in FIG. 7, this resin layer 29 is positioned between peripheral region 26 of wafer 20 and suction section 52. At this time, bump region 25 of wafer 20 is sucked by suction section 52, and peripheral region 26 of wafer 20 is mounted on resin layer 29. Therefore, in the present invention, no annular clearance is formed between peripheral region 26 of wafer 20 and suction section 52.

Then, grindstone 32a of backgrinding section 32 is used to grind back surface 22 of wafer 20. In the present invention, peripheral region 26 of wafer 20 is supported by resin layer 29 and, therefore, stress is not concentrated on bump region 25 of wafer 20, so that bumps B and the like and/or wafer 20 can be prevented from being damaged. Further, in the present invention, no annular clearance is formed and, therefore, the edge of wafer 20 is not broken during the backgrinding process and suction section 52 is not clogged with shavings created as a result of the backgrinding.

These can be accomplished by forming ring-shaped resin layer 29. Then, resin layer 29 can be formed of any resin that can be hardened by heat. Further, dummy member 40 can be made of typical wafer 20. Thus, in the present invention, no special-purpose product has to be prepared for making dummy member 40 and, therefore, the manufacturing cost of the semiconductor chip can be reduced.

Further, when the size of bumps B in wafer 20 to be processed is changed, it suffices to change the grinding amount of resin layer 29 and dummy member 40 depending on the size of bumps B. Therefore, in the present invention, even when the size of bumps B is changed due to design change, such change can be easily accommodated.

While the present invention has been described with reference to the typical embodiments, those skilled in the art can understand that the changes described above and other various changes, omissions or additions can be made without departing from the scope of the present invention.

The invention claimed is:

1. A wafer processing method for processing a wafer having bumps formed on its front surface, comprising the steps of:
   holding, on a table, a bump region-conforming member that has an outer shape conforming only to a bump region of said wafer where said bumps are formed;
   forming a resin layer by applying resin around said bump region-conforming member up to a thickness equal to or greater than that of said bump region-conforming member;
   grinding said bump region-conforming member along with said resin layer to a predetermined thickness;
   removing said bump region-conforming member from said table to form a concave part in said resin layer;
   applying a film on the front surface of said wafer; and
   disposing said wafer in said concave part of said resin layer and holding said wafer on said table so that a back surface of said wafer faces upward.

2. A wafer processing method according to claim 1, wherein said predetermined thickness is equal to the distance between said front surface of said wafer and the top of said bumps.

3. A wafer processing method according to claim 1, further comprising the step of grinding the back surface of said wafer.

4. A wafer processing method according to claim 1, wherein said bump region-conforming member is made of another wafer that has a size identical to that of said wafer.

* * * * *